(12) United States Patent
Forbes

(10) Patent No.: US 12,476,624 B1
(45) Date of Patent: Nov. 18, 2025

(54) LARGE PROGRAMMABLE DELAY AT HIGH FREQUENCY THROUGH ALIASING

(71) Applicant: National Technology & Engineering Solutions of Sandia, LLC, Albuquerque, NM (US)

(72) Inventor: Travis Forbes, Overland Park, KS (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 33 days.

(21) Appl. No.: 18/775,675

(22) Filed: Jul. 17, 2024

(51) Int. Cl.
    H03K 5/01      (2006.01)
    H03H 11/04     (2006.01)
    H03K 5/00      (2006.01)

(52) U.S. Cl.
    CPC .............. H03K 5/01 (2013.01); H03H 11/04 (2013.01); *H03K 2005/00058* (2013.01)

(58) Field of Classification Search
    CPC ................ H03H 11/265; H03K 5/01; H03K 2005/00026
    USPC ........................................................ 327/261
    See application file for complete search history.

(56) References Cited

U.S. PATENT DOCUMENTS

| | | | | |
|---|---|---|---|---|
| 6,500,120 B1 * | 12/2002 | Anthony | ............. | G01S 15/8915 600/443 |
| 6,856,925 B2 * | 2/2005 | Muhammad | ........... | H03D 7/125 455/296 |
| 7,671,658 B2 * | 3/2010 | Harada | ..................... | H03D 7/14 327/554 |
| 7,965,135 B2 * | 6/2011 | Yoshizawa | ........... | H03H 15/023 327/554 |
| 8,164,380 B2 * | 4/2012 | Hosokawa | ............. | H03H 15/00 327/554 |
| 8,229,987 B2 * | 7/2012 | Hosokawa | ............. | H03D 7/125 708/847 |
| 8,340,617 B2 * | 12/2012 | Hosokawa | ............. | H03D 3/007 455/313 |

(Continued)

OTHER PUBLICATIONS

Chang, C.-H. et al., "Analysis and Demonstration of an IIP3 Improvement Technique for Low-Power RF Low-Noise Amplifiers," IEEE Transactions on Circuits and Systems-I: Regular Papers (2018) 65(3):859-869.

(Continued)

*Primary Examiner* — Ryan Jager
(74) *Attorney, Agent, or Firm* — Mark A. Dodd

(57) ABSTRACT

A programmable alias delay device providing output in a desired frequency band and a maximum delay of >5 ns over a broad bandwidth and at a high frequency is disclosed. The device includes an input bandpass filter and an input stage with M sampling switched capacitor elements, reducing the sampling rate by M. The device includes a programmable delay stage with M programmable switched capacitor banks, each bank having N delay switched capacitor storage elements, reducing the sampling rate by M×N. This reduced sampling rate permits smaller sampling switches, with reduced leakage current and longer programmable delay times. The device includes an output reconstruction stage that reconstructs a delayed version of the input signal by combining signals from the programmable delay stage. Using a subsequent output alias filter, an alias band in the desired frequency band is selected and output.

21 Claims, 10 Drawing Sheets

(56) References Cited

U.S. PATENT DOCUMENTS

| | | | | |
|---|---|---|---|---|
| 8,385,874 | B2* | 2/2013 | Abe | H03D 7/1441 |
| | | | | 455/313 |
| 8,433,276 | B2* | 4/2013 | Morishita | H03H 15/023 |
| | | | | 455/313 |
| 8,570,100 | B2* | 10/2013 | Morishita | H03H 15/023 |
| | | | | 455/313 |
| 8,688,067 | B2* | 4/2014 | Morishita | H03H 15/023 |
| | | | | 455/227 |
| 9,093,982 | B2* | 7/2015 | Morishita | H03H 15/023 |
| 9,318,999 | B2* | 4/2016 | Morishita | H03H 19/004 |
| 10,148,253 | B2* | 12/2018 | Xu | H03J 3/08 |
| 10,483,945 | B2* | 11/2019 | Joish | H04B 1/18 |
| 11,054,509 | B2* | 7/2021 | Freeman | G01S 15/8915 |
| 11,683,023 | B1* | 6/2023 | Forbes | H03H 11/265 |
| | | | | 327/278 |
| 12,095,424 | B1* | 9/2024 | Forbes | H03F 3/45179 |
| 2003/0035499 | A1* | 2/2003 | Staszewski | H03D 7/125 |
| | | | | 375/350 |
| 2003/0083033 | A1* | 5/2003 | Staszewski | H03D 7/125 |
| | | | | 455/313 |
| 2005/0036572 | A1* | 2/2005 | Muhammad | H04L 7/007 |
| | | | | 375/322 |
| 2005/0131299 | A1* | 6/2005 | Robinson | G01S 15/8927 |
| | | | | 600/447 |
| 2006/0071707 | A1* | 4/2006 | Belveze | H03H 15/00 |
| | | | | 327/554 |
| 2007/0275684 | A1* | 11/2007 | Harada | H03D 7/14 |
| | | | | 455/185.1 |
| 2009/0002066 | A1* | 1/2009 | Lee | H03H 19/004 |
| | | | | 327/554 |
| 2009/0270061 | A1* | 10/2009 | Hosokawa | H03D 7/125 |
| | | | | 455/323 |
| 2010/0109746 | A1* | 5/2010 | Hosokawa | H03H 15/00 |
| | | | | 327/551 |
| 2011/0176640 | A1* | 7/2011 | Morishita | H03H 19/004 |
| | | | | 375/318 |
| 2011/0183639 | A1* | 7/2011 | Morishita | H03H 15/023 |
| | | | | 327/105 |
| 2012/0197130 | A1* | 8/2012 | Amemiya | G01S 7/52025 |
| | | | | 600/459 |
| 2014/0264050 | A1* | 9/2014 | Rostaing | H03H 11/265 |
| | | | | 250/371 |
| 2016/0173145 | A1* | 6/2016 | Forbes | H03F 3/245 |
| | | | | 375/219 |
| 2022/0263472 | A1* | 8/2022 | Moody | H03F 3/195 |

OTHER PUBLICATIONS

Chi, T. et al., "A Millimeter-Wave Polarization-Division-Duplex Transceiver Front-End With an On-Chip Multifeed Self-Interference-Canceling Antenna and an All-Passive Reconfigurable Canceller," IEEE Journal of Solid-State Circuits (2018) 53(12):3628-3639.

Chu, K. D. et al., "A Broadband and Deep-TX Self-Interference Cancellation Technique for Full-Duplex and Frequency-Domain-Duplex Transceiver Applications," 2018 IEEE International Solid-State Circuits Conference, Session 9, Wireless Transceivers and Techniques, 9.7, 3 pages.

Garakoui, S. K. et al., "A 1-to-2.5GHz Phased-Array IC Based on gm-RC All-Pass Time-Delay Cells," ISSCC 2012, Session 4, RF Techniques, 4.4, pp. 80-82.

Hu, F. et al., "A 1-20 GHz 400 ps True-Time Delay With Small Delay Error in 0.13 11m CMOS for Broadband Phased Array Antennas," 2015 IEEE MTT-S International Microwave Symposium, 3 pages.

Li, M. et al., "An 800-ps Origami True-Time-Delay-Based CMOS Receiver Front End for 6.5-9-GHz Phased Arrays," IEEE Solid-State Circuits Letters (2020) 3:382-385.

Mak, P.-I. et al., "A 0.46-mm2 4-dB NF Unified Receiver Front-End for Full-Band Mobile TV in 65-nm CMOS," IEEE Journal of Solid-State Circuits (2011) 46(9):1970-1984.

Mondal, I.et al., "A 2-GHz Bandwidth, 0.25-1.7 ns True-Time-Delay Element Using a Variable-Order All-Pass Filter Architecture in 0.13 μm CMOS," IEEE Journal of Solid-State Circuits (2017) 52(8):2180-2193.

Moody, J. et al., "A mmW Receiver Exploiting Complementary Current Reuse and Power Efficient Bias Point," IEEE Transactions on Microwave Theory and Techniques (2024) 72(3):1706-1718.

Nagulu, A. et al., "Full-Duplex Receiver with Wideband Multi-Domain FIR Cancellation Based on Stacked-Capacitor, N-Path Switched-Capacitor Delay Lines Achieving >54dB SIC Across 80MHz BW and >15dBm TX Power-Handling," 2021 IEEE International Solid-State Circuits Conference, Session 6, High-Performance Receivers and Transmitters for Sub-6GHZ Radios, 6.6, 3 pages.

Nagulu, A. et al., "A Full-Duplex Receiver Leveraging Multiphase Switched-Capacitor-Delay Based Multi-Domain FIR Filter Cancelers," 2020 IEEE Radio Frequency Integrated Circuits Symposium, pp. 43-46.

Nauta, B., "A CMOS Transconductance-C Filter Technique for Very High Frequencies," IEEECircuits (1992) 27(2):142-153.

* cited by examiner

LARGE PROGRAMMABLE DELAY AT HIGH FREQUENCY THROUGH ALIASING

STATEMENT OF GOVERNMENT SUPPORT

This invention was made with Government support under Contract No. DE-NA0003525 awarded by the United States Department of Energy/National Nuclear Security Administration. The U.S. Government has certain rights in the invention.

BACKGROUND OF THE INVENTION

Field of the Invention

The present invention generally relates to switched capacitor delays, and specifically relates to multi-stage switched capacitors that can achieve a large programmable delay using aliasing.

Brief Description of the Related Art

True-time delay devices have seen significant deployment in broadband phased array applications to electronically steer an array, while maintaining directivity across a large operating bandwidth. Maximum achieved delays on a single device at frequencies greater than 2 GHz have been limited to less than 1.5 ns, and at frequencies greater than 9 GHz, delays have been limited to less than 550 ps. However, other applications, such as radar testers, digital radio frequency (RF) memory, and active RF identification (RFID) tagging devices, require much longer time delays, on the order of 10s to 100 s of nanoseconds, in the signal path for target simulation in radar testers and digital RF memory, and to prevent oscillations in active RFID tags. Achieving nanosecond delays directly at RF frequencies, X band for example, using traditional delay devices, required downconverting the RF signal to a lower intermediate frequency, delaying the signal, and then upconverting the signal back to the RF carrier. Such a process consumes significant power for the downconversion and upconversion process, and results in a limited operating bandwidth on the order of <500 MHz.

To date, delays in excess of 10 ns at frequencies greater than 2 GHz have been achieved by employing spools of coaxial or optical cable that are physically large and limited to a laboratory environment due to size. For example, a typical coaxial delay is 6.7 ns/m of cable so a 10 ns delay may take a 1.5 m cable to achieve (whereas various embodiments of the invention described below can achieve the same 10 ns in less than 1.5 mm, a 1000× reduction). However, coaxial and optical approaches to delay have no inherent programmability, which results in a requirement for a physical cable spool for each delay required in the given system.

Other miniature delay approaches include $g_m$-C all-pass filters, inductor-capacitor (LC) artificial delay lines, and switched-capacitor circuits. Gm-C all-pass filters have achieved up to 2 ns delay at RF but are limited to frequencies of less than 2.5 GHz. See S. Garakoui et al., "A 1-to-2.5 GHz Phased-Array IC Based on $g_m$-RC All-Pass Time-Delay Cells," IEEE International Solid-State Circuits Conference, pp. 80-82 (2012) and I. Mondal and N. Krishnapura, "A 2-GHz Bandwidth, 0.25-1.7 ns True-Time-Delay Element Using a Variable-Order All-Pass Filter Architecture in 0.13 μm CMOS," IEEE Journal of Solid-State Circuits, vol. 52, no. 8, pp. 2180-2193 (2017). LC artificial delay lines are traditionally used as true-time delay devices in phased arrays and may be used at frequencies exceeding 12 GHz but have been limited to delays of less than 550 ps due to limitations such as large physical size. See F. Hu et al., "A 1-20 GHz 400 ps True-Time Delay with Small Delay Error in 0.13 um CMOS for Broadband Phased Arrays," IEEE International Microwave Symposium (2015) and M. Li et al., "An 800-ps Origami True-Time-Delay-Based CMOS Receiver Front End for 6.5-9 GHz Phased Arrays," IEEE Solid-State Circuits Letters, vol. 3, pp. 382-385 (2020).

U.S. Pat. No. 11,683,023, assigned to the same assignee as this application, discloses a switched-capacitor delay device that can provide programmable delay of more than 100 ns over a broad bandwidth up to 2 GHz RF frequency. However, achieving nanoseconds of delay at higher frequency operation requires the use of a sampling clock running at a higher sampling clock frequency $F_S$, which increases power consumption and is beyond a given sample rate is challenging to implement in practice. Thus, the need exists for a programmable alias delay device that can operate at higher frequencies without the need for a higher sampling clock frequency $F_S$.

SUMMARY OF THE INVENTION

One aspect of the present invention relates to a programmable alias delay device that provides a maximum delay of more than 5 ns over a broad bandwidth (>500 MHz), while operating at high frequencies (>2 GHz) though the use of aliasing of the sampling clock frequency $F_S$. To accomplish this, the programmable alias delay device includes an input bandpass filter to select a desired input frequency band along with an input stage that employs M sampling switched capacitor storage elements such that while the input RF signal is sampled at a frequency $F_S$, each individual sampling switched capacitor storage element samples at a rate of only $F_S/M$. The programmable alias delay device further includes a programmable delay stage with M programmable switched capacitor banks, with each programmable switched capacitor bank having N delay switched capacitor storage elements. Thus, the programmable delay stage includes a total of M×N delay switched capacitor storage elements, thereby effecting an M×N reduction in the sampling rate at the individual delay switched capacitor storage element level. This reduced sampling rate permits the use of much smaller sampling switches, resulting in reduced leakage current and the ability to implement far longer programmable delay times. The programmable alias delay device includes an output reconstruction stage that reconstructs a programmably delayed version of the input RF signal by reconstructing signals from the programmable delay stage. Using a subsequent output alias filter, one can select a desired alias band to produce a delayed version of the input RF signal. The input bandpass and output alias filters may be switchable to select one of multiple bands, it may be a tunable filter, or it may be implemented using a switched amplifier chain operating in the desired input/output frequency band.

In at least a first embodiment, a programmable alias delay device, designed for manipulating RF signals through a series of stages to achieve a desired delay effect, includes an input bandpass filter for filtering incoming RF signals into a desired frequency band, an input sampling stage with multiple switched capacitor storage elements for sequentially sampling the filtered RF signal, a programmable delay stage comprising multiple banks of switched capacitor storage elements for further sampling and holding the signal, thereby introducing a programmable delay, an enable timing circuit that receives a desired delay value and controls the output reconstruction stage based on this value, an output reconstruction stage that sequentially outputs the delayed signal, and an output alias filter for filtering the delayed output signal into a desired output frequency band.

In variations of the first embodiment, the device includes switchable bandpass filters and amplifiers in both the input and output stages to accommodate different frequency bands and amplify signals; the device includes variable capacitors, including varactors and configurations of individual capacitors with switches, for tuning the switchable bandpass filters; the device includes a switchable amplifier chain circuit in the output alias filter for amplifying and selecting frequency bands of the delayed signal; the device further includes an input buffer stage for amplifying the signal before sampling; the number of sampling elements (M≥4) and delay elements (N≥2) ensure adequate sampling and delay capabilities; the device employs various detailed configurations for the sampling and delay elements, including capacitors and switches for signal handling and resetting; the device employs clock division mechanisms for controlling the timing of sampling and delay operations, including divide-by-M, divide-by-N, and pulse extension clocks for precise timing control across various stages of the device; and flexibility in handling input and output frequency bands, allowing them to be less than, the same as, or greater than each other.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

FIG. 3A illustrates a block diagram, while

FIGS. 4A and 4B illustrate input bandpass and output alias filters, respectively, while

DETAILED DESCRIPTION OF THE INVENTION

The terms "a" and "an" do not denote a limitation of quantity, but rather denote the presence of at least one of the referenced items. The term "or" means "and/or." The terms "comprising," "having," "including," and "containing" are to be construed as open-ended terms (i.e., meaning "including, but not limited to").

Figure 1:
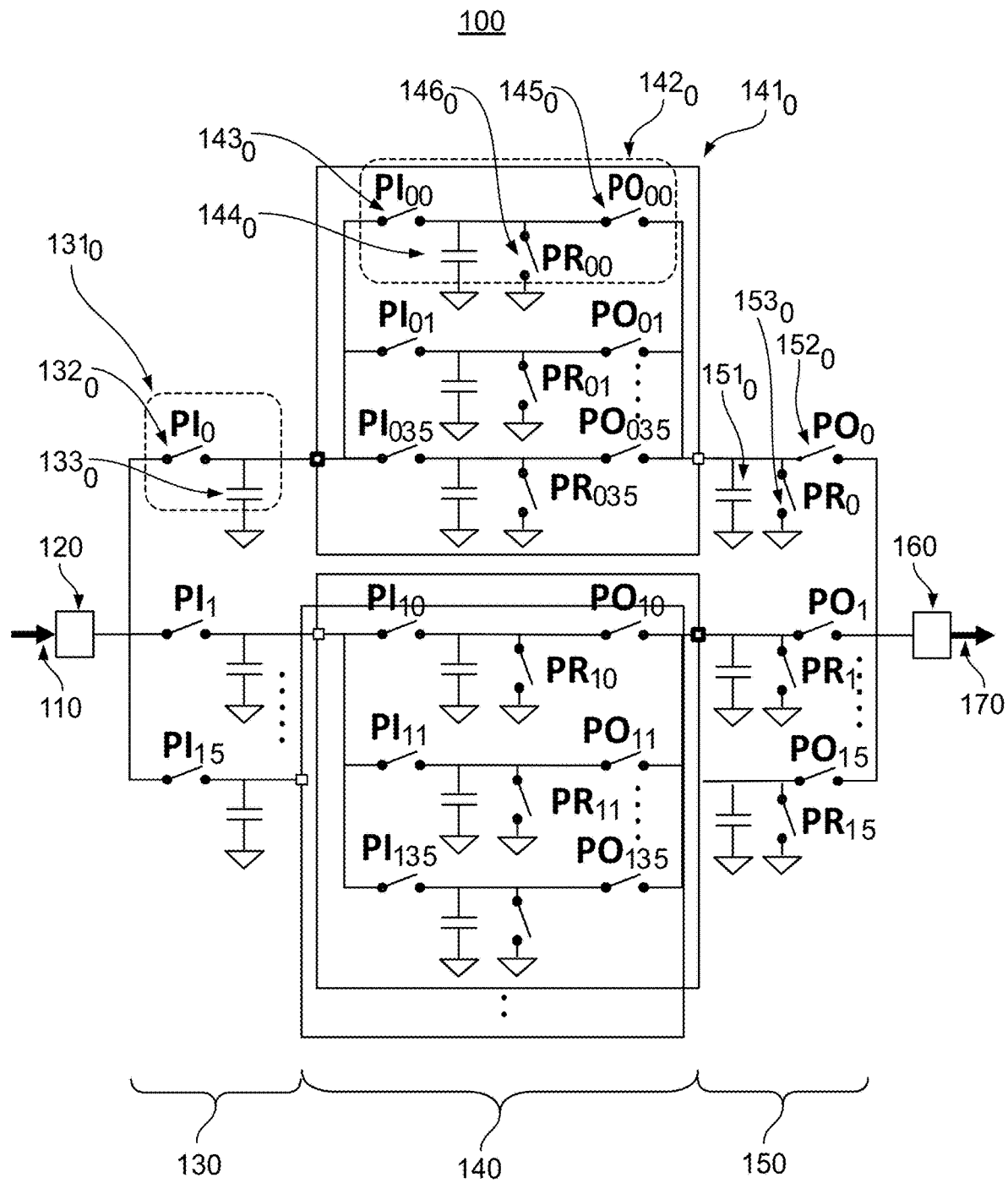
FIG. 1 illustrates a single-ended programmable alias delay device in accordance with one or more embodiments of the present invention.

FIG. 1 illustrates a single-ended configuration programmable alias delay device 100 in accordance with one or more embodiments employing a time-interleaved multistage switched-capacitor (TIMS-SC) architecture. The programmable alias delay device 100 is preferably implemented in a differential manner as described below with reference to FIG. 3. The programmable alias delay device 100 includes an input bandpass filter 120, which may include a buffer or amplifier to provide the desired power for an input RF signal 110. The input bandpass filter 120, and its companion output alias filter 160, are described in detail below. The bandpass filtered (and optionally amplified) input RF signal 110, i.e., the input band RF signal, is then sent to a sampling stage 130 of sixteen sampling switched capacitor storage elements $131_0$-$131_{15}$. Each sampling switched capacitor storage element $131_0$-$131_{15}$ includes a corresponding input sampling switch $132_0$-$132_{15}$ ($PI_0$-$PI_{15}$) and corresponding input sampling capacitor $133_0$-$133_{15}$. The sixteen sampling switched capacitor storage elements $131_0$-$131_{15}$ are sequentially coupled to the input band RF signal via corresponding input sampling switches $132_0$-$132_{15}$, thereby sequentially sampling the input band RF signal. For example, sampling switched capacitor storage element $131_0$ temporarily stores samples 1, 17, etc., while sampling switched capacitor storage element $131_1$ temporarily stores samples 2, 18, etc. This sampling process will be described below with respect to the timing diagram 200 in FIG. 2. The signals held by the sixteen sampling switched capacitor storage elements $131_0$-$131_{15}$ are termed input sampled signals. Each of the sixteen sampling switched capacitor storage elements $131_0$-$131_{15}$ is coupled to a corresponding programmable switched capacitor bank $141_0$-$141_{15}$ in a programmable delay stage 140.

In this illustrated embodiment, the input sampling stage 130 is a 16-phase switched capacitor network sampling at the full sampling rate of $F_S$. While the input sampling stage 130 illustrated in FIG. 1 has sixteen sampling switched capacitor storage elements $131_0$-$131_{15}$, i.e., is a 16-phase switched capacitor network, other embodiments may have an input sampling stage with M sampling switched capacitor storage elements, resulting in an M-phase switched capacitor network. In these embodiments, M may be smaller or larger than 16, though M is preferable 4 or greater. Further, in this embodiment with sixteen programmable switched capacitor banks $141_0$-$141_{15}$, each programmable switched capacitor bank $141_0$-$141_{15}$ has a sampling rate of $F_S/16$.

As illustrated in FIG. 1, each programmable switched capacitor bank $141_0$-$141_{15}$ includes 36 delay switched capacitor storage elements $142_0$-$142_{35}$. Each delay switched capacitor storage element $142_0$-$142_{35}$ includes a corresponding input switched bank switch $143_0$-$143_{35}$ ($PI_{0,0}$-$PI_{0,35}$) and corresponding switched bank sampling capacitor $144_0$-$144_{35}$. The 36 delay switched capacitor storage elements $142_0$-$142_{35}$ are coupled to a corresponding input sampling capacitor $133_0$-$133_{15}$ via corresponding input switched bank switches $143_0$-$143_{35}$ in a time interleaved manner, thereby sampling a corresponding input sampled signal. Thus, the programmable delay stage 140 includes a total of 16×36=576 delay switched capacitor storage elements, i.e., 576 input switched bank switches and 576 switched bank sampling capacitors. The signals held by the 576 delay switched capacitor storage elements are termed delay sampled switched signals. Each delay switched capacitor storage element $142_0$-$142_{35}$ is coupled to a corresponding delay output switch $145_0$-$145_{35}$ ($PO_{0,0}$-$PO_{0,35}$). Corresponding input reset switches $146_0$-$146_{35}$ ($PR_{0,0}$-$PR_{0,35}$) are placed in parallel with corresponding switched bank sampling capacitors $144_0$-$144_{35}$ so that the switched bank sampling capacitors $144_0$-$144_{35}$ (and thus the delay switched capacitor storage elements $142_0$-$142_{35}$) may be reset, i.e., discharged, in preparation for the next sampling cycle.

While the programmable delay stage 140 illustrated in FIG. 1 has sixteen programmable switched capacitor banks $141_0$-$141_{15}$, other embodiments may have a programmable delay stage with M programmable switched capacitor banks. In these embodiments, M may be smaller or larger than 16, though the number of programmable switched capacitor banks in the programmable delay stage must equal the number of sampling switched capacitor storage elements in the input sampling stage. Further, while each programmable switched capacitor bank $141_0$-$141_{15}$ illustrated in FIG. 1 includes 36 delay switched capacitor storage elements $142_0$-$142_{35}$, other embodiments may have programmable switched capacitor banks with N delay switched capacitor storage elements. In these embodiments, N may be smaller or larger than 36, with a larger value for N resulting in a greater range of programmable delay times and a larger physical device.

While the programmable delay stage 140 illustrated in FIG. 1 has a passive configuration, other embodiments may have an active configuration. Specifically, in embodiments having this active configuration, each of the delay switched capacitor storage elements $142_0$-$142_{35}$ further includes a buffer (not illustrated).

Each of the sixteen programmable switched capacitor banks $141_0$-$141_{15}$ is coupled to a corresponding output capacitor $151_0$-$151_{15}$ that holds a corresponding delay sampled switched signal and a corresponding output reconstruction switch $152_0$-$152_{15}$ ($PO_0$-$PO_{15}$) in an output reconstruction stage 150. Corresponding output reset switches $153_0$-$153_{15}$ ($PR_0$-$PR_{15}$) are placed in parallel with corresponding output capacitors $151_0$-$151_{15}$ so that the output capacitors $151_0$-$151_{15}$ may be reset, i.e., discharged, in preparation for the next sampling cycle. The signals output by the sixteen output reconstruction switches $152_0$-$152_{15}$ are termed output reconstruction signals. In this embodiment, the output reconstruction stage 150 is a 16-phase switching network operating at the full sampling rate of $F_S$. The output reconstruction stage 150, based on the sequential switching of the output reconstruction switches $152_0$-$152_{15}$, outputs a reconstructed delayed output RF signal that is coupled to an output alias filter 160 used to select a desired alias band of the reconstructed delayed output RF signal. This alias band output RF signal 170 corresponds to a programmed time delayed version of the input RF signal 110 in a desired frequency band.

In certain embodiments, the output alias filter 160, like the input bandpass filter 120, may include a buffer or amplifier to provide the desired power in the alias band output RF signal 170.

Figure 2:
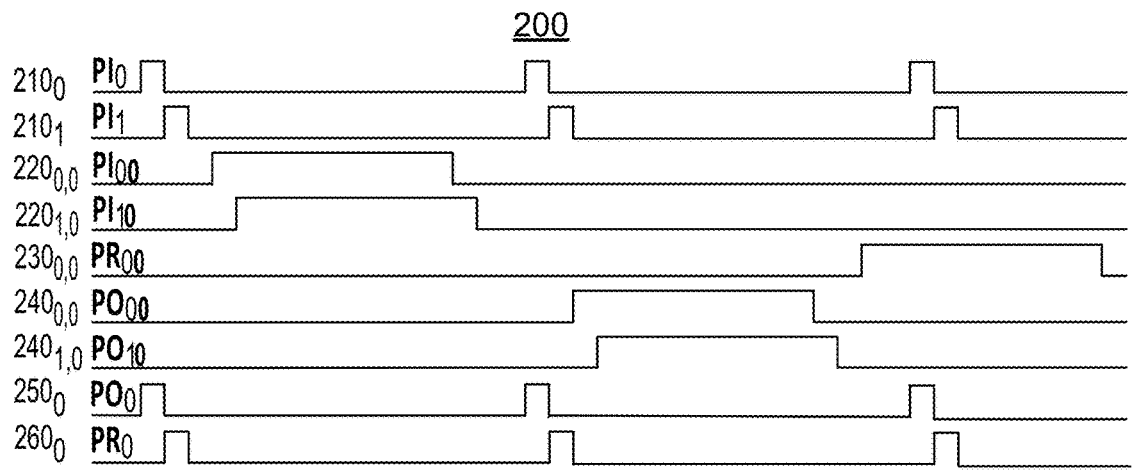
FIG. 2 illustrates a timing diagram for a programmable alias delay device in accordance with one or more embodiments of the present invention.

FIG. 2 illustrates a timing diagram 200 for the programmable alias delay device 100 illustrated in FIG. 1. The first two lines $210_0$, $210_1$ of the timing diagram 200 correspond to the sampling of the input RF signal 110 by the first two sampling switched capacitor storage elements $131_0$, $131_1$ via input sampling switches $132_0$, $132_1$, i.e., clocks $PI_0$ and $PI_1$. As such, these clocks are pulsed once every sixteen clock cycles as there are sixteen sampling switched capacitor storage elements $131_0$-$131_{15}$ in the sampling stage 130. The next two lines $220_{0,0}$, $220_{1,0}$ correspond to the sampling of the signals output by the first two sampling switched capacitor storage elements $131_0$, $131_1$ by the first two delay switched capacitor storage elements $142_0$, $142_1$ of the first programmable switched capacitor bank $141_0$, i.e., clocks $PI_{0,0}$ and $PI_{0,1}$. The next line $230_{0,0}$ of the timing diagram 200 corresponds to the input reset switch 1460 ($PR_{0,0}$), which resets, i.e., discharges, the switched bank sampling capacitor 1440. The next two lines $240_{0,0}$, $240_{1,0}$ of the timing diagram 200 correspond to the output timing of the first delay switched capacitor storage element $142_0$ of the first programmable switched capacitor bank $141_0$ and the first delay switched capacitor storage element $142_0$ of the second programmable switched capacitor bank 1411, i.e., clocks $PO_{0,0}$ and $P0_{1,0}$, respectively. Note that the events in lines $220_{0,0}$, $220_{1,0}$, $230_{0,0}$, $240_{0,0}$, and $240_{1,0}$ occur once every 16×36=576 clock cycles, as these events occur in the programmable delay stage 140. The next line $250_0$ of the timing diagram 200 corresponds to the output timing of the first output reconstruction switch $152_0$, i.e., clock $PO_0$. The last line $260_0$ of the timing diagram 200 corresponds to the output reset switch $153_0$ ($PR_0$), which resets, i.e., discharges, the output capacitor 1510. The events in lines $250_0$ and $260_0$ occur once every sixteen clock cycles as there are sixteen output capacitors $151_0$-$151_{15}$ in the output reconstruction stage 150.

As reflected by the first two lines $210_0$, $210_1$, the input band RF signal is sampled at a sampling rate of $F_S$ with a period of $T=1/F_S$, with the first two sampling switched capacitor storage elements $131_0$, $131_1$ sampling the first T and second T of the input band RF signal, respectively. The first line $210_0$ shows the sampling of the input band RF signal that generates input sampled signals 1, 17, 33, etc., while the second line $210_1$ shows the sampling of the input band RF signal that generates input sampled signals 2, 18, 34, etc. The third line $220_{0,0}$ shows the storage of input sampled signal 1 by the first delay switched capacitor storage element $142_0$ in the first programmable switched capacitor bank $141_0$ as delay sampled switched signal 1. The fourth line $220_{1,0}$ shows the storage of input sampled signal 2 by the second delay switched capacitor storage element $142_1$ in the first programmable switched capacitor bank $141_0$ as delay sampled switched signal 2. The fifth line $230_{0,0}$ shows the resetting of switched bank sampling capacitor $144_0$ by input reset switch $146_0$. The sixth line $240_{0,0}$ shows the passing of delay sampled switched signal 1, while the seventh line $240_{1,0}$ shows the passing of delay sampled switched signal 2. The eighth line $250_0$ shows the passing of delay sampled switched signal 1 stored by the first output capacitor $151_0$ via the output reconstruction switch $152_0$ as output reconstruction signal 1. The ninth line $260_0$ shows the resetting of output capacitor $151_0$ by output reset switch $153_0$.

While the settling time T is $1/F_S$ in the input sampling stage 130, settling time expansion is created in the programmable delay stage 140 by allowing sample transfer from the input sampling stage 130 to the programmable delay stage 140 to continue during the input sampling stage 130 hold time. With the expanded sample time, the sampler bandwidth required in the programmable delay stage 140 is greatly reduced. This allows the use of much smaller input switched bank switches $143_0$-$143_{35}$ in the delay switched capacitor storage elements $142_0$-$142_{35}$ of the programmable delay stage 140, which in turn enables a large reduction in OFF state sample leakage. This leakage reduction enables a corresponding increase in the maximum achievable hold time, which is key to achieving more than 5 ns of delay. (The programmable alias delay device 100 illustrated in FIG. 1 achieved a maximum delay of approximately 40 ns at a sampling frequency $F_S$ of 14 GHz with an operating band of 8-12 GHz.)

To reduce timing skew sensitivity, the programmable delay stage 140 input clock signal $PI_{x,y}$ transitions after the input sampling stage 130 input sample clock signal $PI_x$, where x corresponds to the path in the input sampling stage 130 (i.e., it has a value from 0 to 15) and y corresponds to the path in the programmable delay stage 140 (i.e., it has a value from 0 to 35). Thus, the programmable delay stage 140 input is static during clock transitions (e.g., $PI_{1,0}$ after $PI_1$). After the programmed delay, a programmable delay stage 140 output clock signal $PO_{x,y}$ initiates the transfer of the delay sampled switched signals to the inputs of the corresponding output capacitors $151_0$-$151_{15}$, again time expanded. The output capacitors $151_0$-$151_{15}$ output the delay sampled switched signals employing a 16-phase clock timing ($PO_x$) that, while based upon the same master clock as the input sampling stage 130 ($PI_x$), is independent thereof, as output reconstruction signals. Timing skew is again mitigated by transitioning the programmable delay stage 140 output clock signal $PO_{x,y}$ prior to the output reconstruction stage 150 output clock signal $PO_x$. The input ($PI_{x,y}$) and output ($PO_{x,y}$) clocks in the programmable delay stage 140 are generated by two separate, but synchronous, divide-by-36 clocks, as will be described below with reference to FIG. 3. The delay is programmed by delaying the enable timing (described below with reference to FIG. 3) of the programmable delay stage 140 output clock signal $PO_x$,o relative to the associated input clock signal $PI_{x,0}$. For the programmable alias delay device 100 illustrated in FIG. 1, as implemented and characterized (see below), the delay can be programmed over a range from $31/F_s$ to $564/F_s$ (in $1/F_s$ increments) and scales with the sample frequency $F_S$.

Figure 3A:
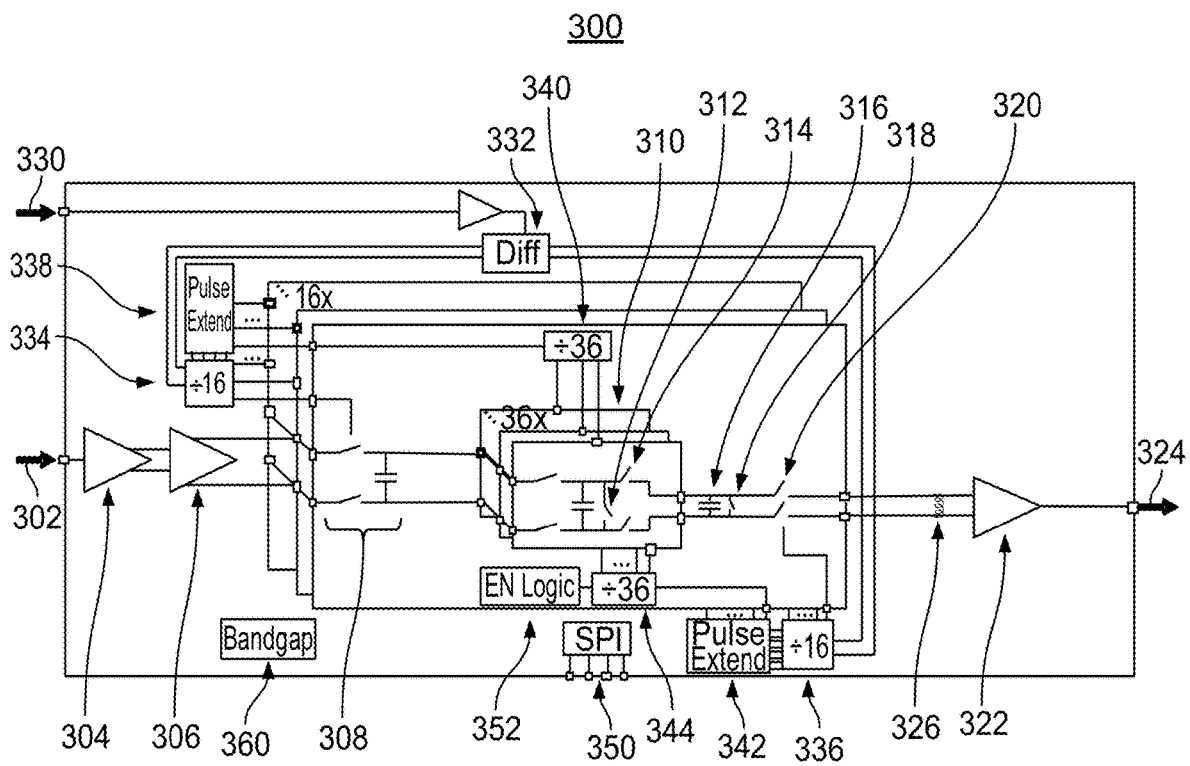
Figure 3B:
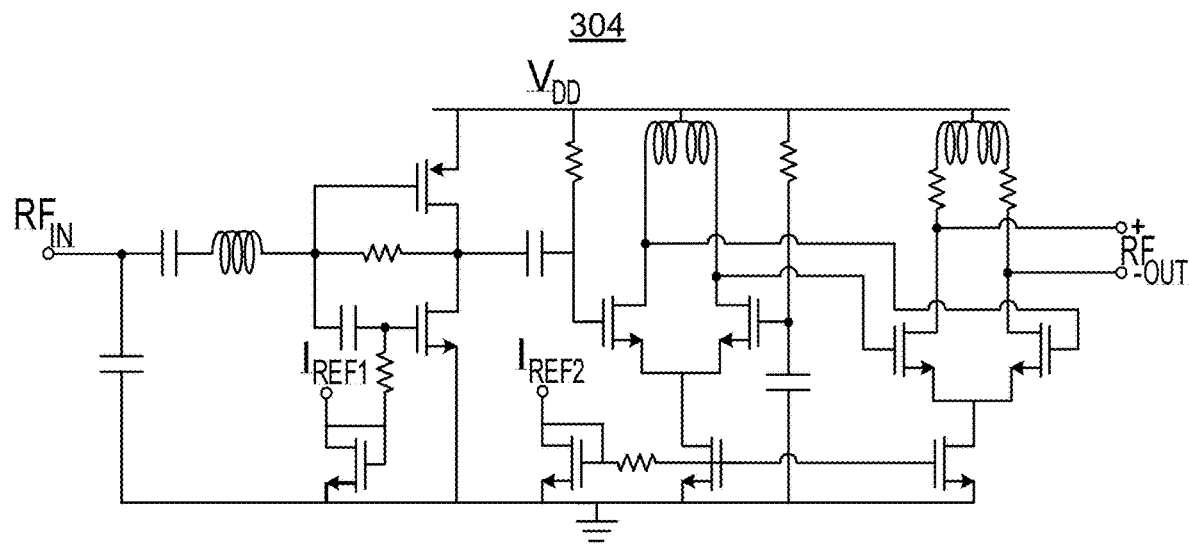
FIGS. 3B-3D illustrate corresponding circuit diagrams, for a differential embodiment of a programmable alias delay device in accordance with one or more embodiments of the present invention.
Figure 3C:
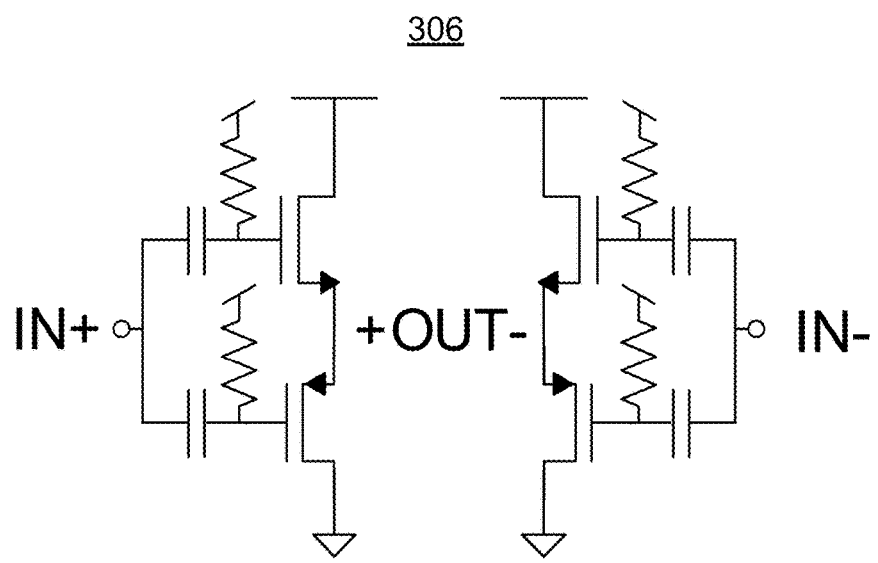
Figure 3D:
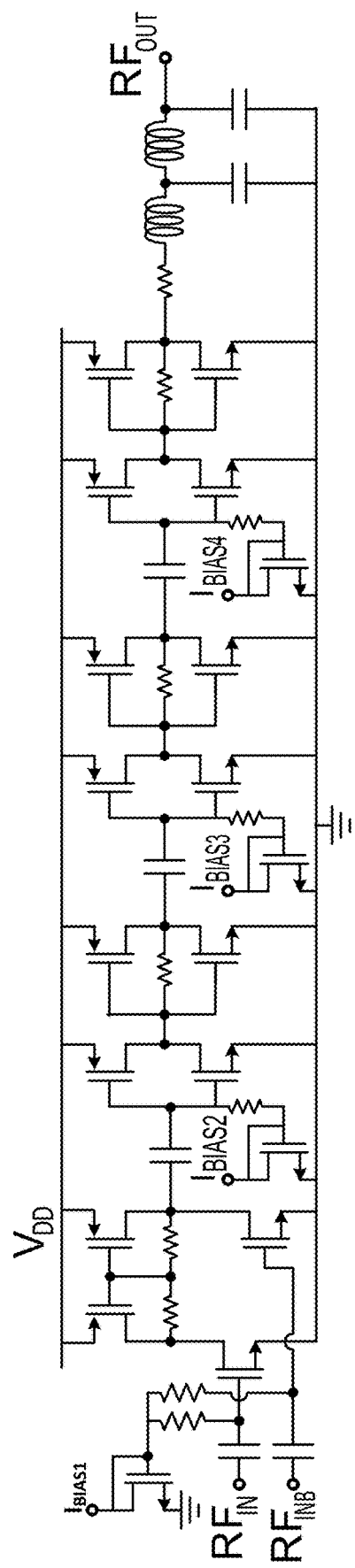

FIG. 3A illustrates a block diagram while FIGS. 3B-3D illustrate corresponding exemplary circuit diagrams for a differential configuration embodiment of a programmable alias delay device 300 in accordance with one or more embodiments. The programmable alias delay device 300 may, for example, be formed of CMOS circuitry on a single Si substrate, though other embodiments may, for example, employ circuitry formed of other IV, III-V, or II-VI semiconductor materials. A bandpass low noise amplifier (LNA) 304, corresponding to input bandpass filter 120, receives an input RF signal 302 and provides bandpass filtering, gain, and differential conversion (see FIG. 3B). The bandpass LNA 304 illustrated in FIG. 3B includes multiple inductor-capacitor (LC) tank circuits to provide bandpass filtering of the input RF signal 302, though other embodiments may employ alternative bandpass filtering configurations. In the bandpass LNA 304 illustrated in FIG. 3B, each inductor load forms an LC tank circuit with a corresponding field effect transistor (FET) capacitance. A device input buffer 306 provides isolation between the output of the bandpass LNA 304 and sampling switched capacitor storage elements 308 of the input sampling stage, and employs a current-reuse source follower (see FIG. 3C). Each sampling switched capacitor storage element 308 employs a differential capacitor having, for example, a capacitance of 250 fF, for small area and sampling noise. Note that the differential capacitor may be physical or parasitic (due, for example, to the parasitic routing capacitance within the programmable delay stage). The differential capacitors store corresponding input sampled signals. The 36 delay switched capacitor storage elements 310 per programmable switched capacitor bank each employs a differential capacitor for storing corresponding delay sampled switched signals. Within each delay switched capacitor storage element 310 is a corresponding input reset switch 312 used to reset the delay switched capacitor storage element 310. Each delay switched capacitor storage element 310 is coupled to a corresponding output capacitor 316 via an output switch 314. In parallel with each output capacitor 316 is a corresponding output reset switch 318 used to reset the output capacitor 316.

An output reconstruction switch 320 outputs a corresponding output reconstruction signal from the output capacitor 316, which is coupled to a bandpass output buffer 322, corresponding to the output alias filter 160. An inductor 326 across the input to the output buffer 322 may be used to form an LC tank circuit-based bandpass filter when combined with the output capacitor 316. The bandpass output buffer 322 provides balun and matching operations and employs an inverter-based amplifier and inverter-based output stage (see FIG. 3D) that outputs an alias band output RF signal 324. The bandpass output buffer 322 permits selection of an alias band having the desired output frequency band. In contrast to the bandpass LNA 304 illustrated in FIG. 3B, the bandpass output buffer 322 includes low frequency blocking capacitors and high frequency resistor-capacitor circuits to provide bandpass filtering to generate the alias band output RF signal 324, though other embodiments may employ alternative bandpass filtering configurations.

Clocking is provided from an input clock 330 at a frequency $F_S$, which is then converted from single-ended to differential, by differential element 332. While the programmable alias delay device 300 illustrated in FIG. 3A does not include a selectable clock divider (for example, $F_{CLK}=F_S$, $2F_S$, or $4F_S$), other embodiments may include a clock divider in the clock tree, or may include a fixed divide-by-P clock as desired. An input divide-by-16 clock 334 generates the input sample clock signal PIX. An output divide-by-16 clock 336 generates the output reconstruction clock signal $PO_x$, the output reconstruction clock signal $PO_x$ may be controlled independently of the input sample clock signal PIR for low timing skew at the input sampling stage (sampling switched capacitor storage elements 308) and the output reconstruction stage (output reconstruction switches 320) based on the clock signal from the differential element 332. In the more general case, the input divide-by-16 clock 334 and the output divide-by-16 clock 336 would both be divide-by-M clocks.

The input sample clock signal $PI_x$ from the input divide-by-16 clock 334 is pulse extended to a 50% duty cycle by an input pulse extend clock 338. The input pulse extend clock 338 drives input divide-by-36 clocks 340, which generate the input clock signals $PI_{x,y}$, and which are placed inside each programmable switched capacitor bank area for standard logic implementation compatibility. The output reconstruction clock signal $PO_x$ from the output divide-by-16 clock 336 is pulse extended to a 50% duty cycle by an output pulse extend clock 342. The output pulse extend clock 342 drives output divide-by-36 clocks 344, which generate output clock signals $PO_{x,y}$, and which are placed inside each programmable switched capacitor bank area for standard logic implementation compatibility.

In the more general case, the input divide-by-36 clocks 340 and the output divide-by-36 clocks 344 would be divide-by-N clocks. While the programmable alias delay device 300 illustrated in FIG. 3A includes an input pulse extend clock 338 and an output pulse extend clock 342, other embodiments may not include one or both pulse extend clocks 338, 342, though this may require custom logic circuitry. While the programmable alias delay device 300 illustrated in FIG. 3A includes both an input divide-by-16 clock 334 and an output divide-by-16 clock 336, other embodiments may employ a single divide-by-16 clock (or more generally a divide-by-M clock), though this may result in clock timing skew issues.

The programmable delay in the illustrated embodiment operates as follows. The desired delay value Z will be a six-bit value corresponding to the desired delay value. The desired delay, implemented by the sixteen programmable delay stages 140, provides from 1 to 36 steps, with each delay step corresponding to a delay of $16/F_S$. The delay value Z, corresponding to delays of $16/F_S$ to $576/F_S$ in $16/F_S$ increments, is entered using a serial programming interface 350 by an external programming source. The serial programming interface 350 outputs the desired delay value to a digital counter in the enable timing logic circuit 352. The digital counter is enabled at the same time as the input divide-by-36 clocks 340, which generate the input clock signals $PI_{x,y}$. The digital counter counts up to the programmed desired delay value. Once the digital counter reaches the programmed desired delay value, the output divide-by-36 clocks 344, which generate output clock signals $PO_{x,y}$, are enabled, thereby causing the first sample to transfer to the corresponding output reconstruction switch 320. The output clock signals $PO_{x,y}$ continue to cause the transfer of samples to the output reconstruction switches 320 indefinitely and are delayed relative to the input clock signals $PI_{x,y}$ by the desired delay. Note that a given programmed desired delay value will produce a constant delay across all alias bands for all input frequencies.

Figure 4A:
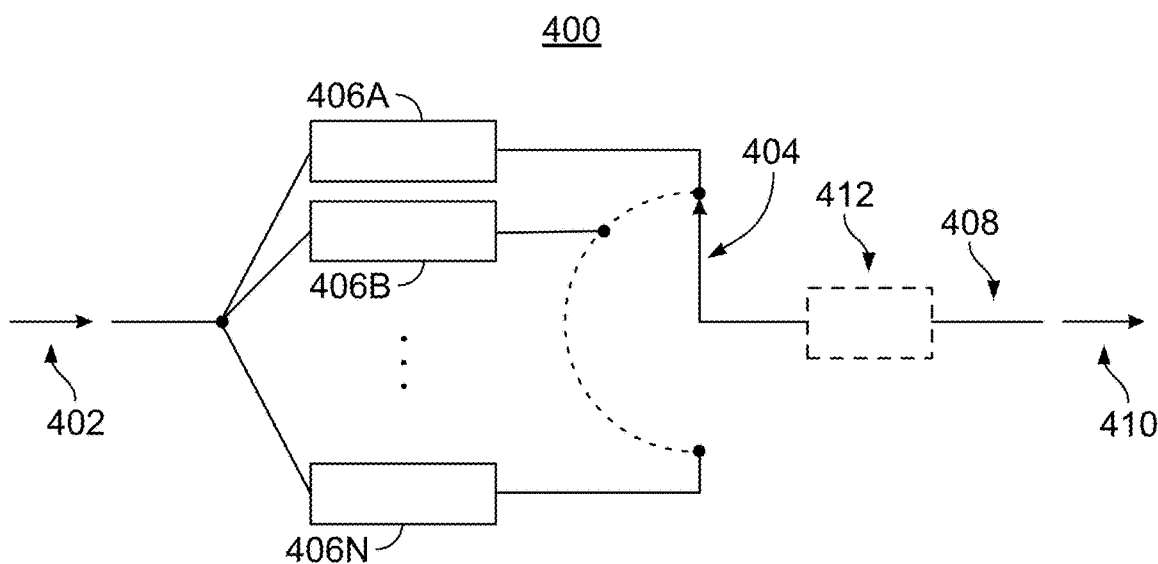
Figure 4B:
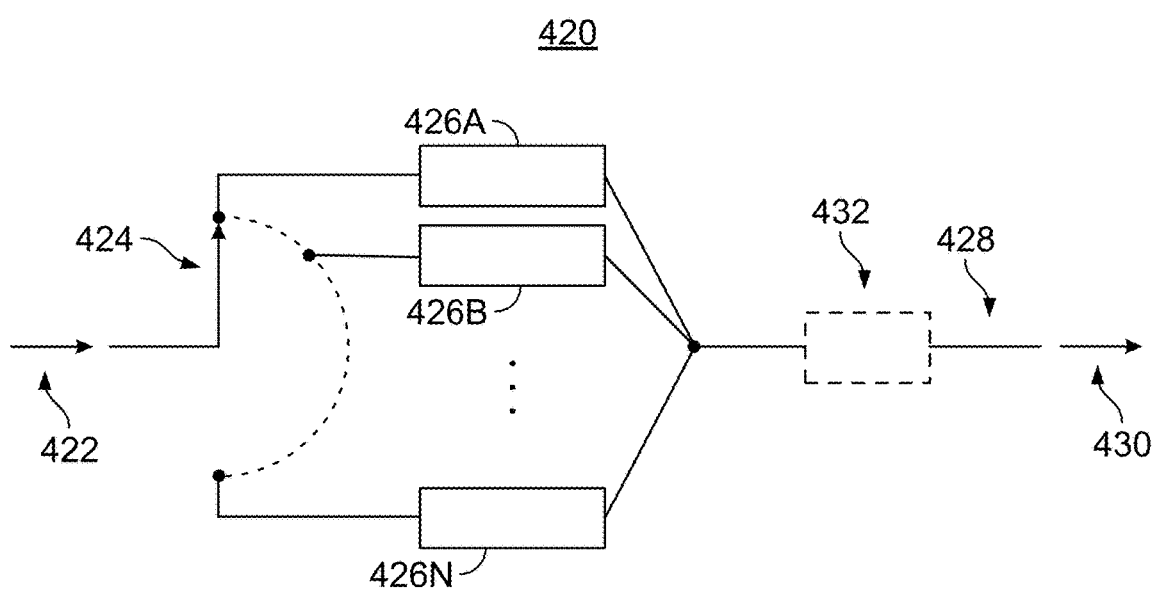
Figure 4C:
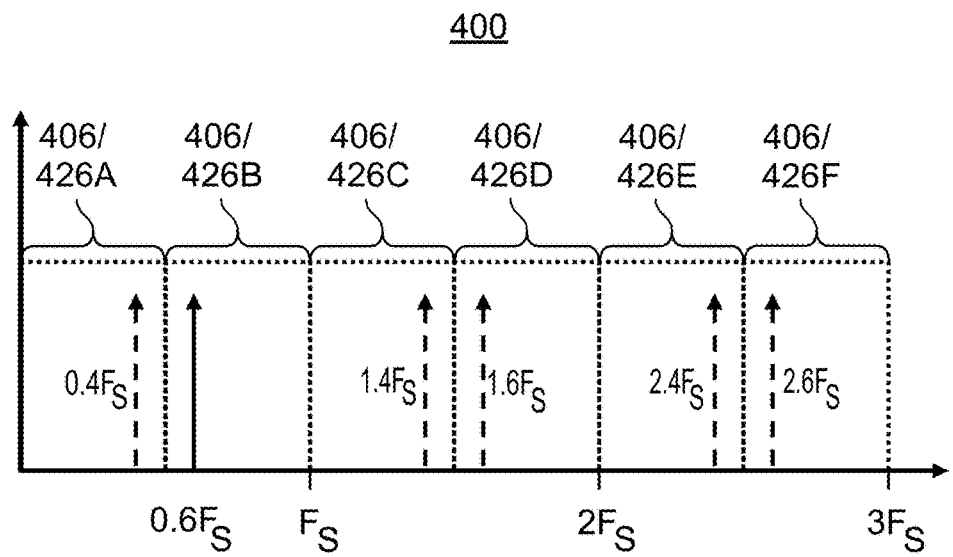
FIG. 4C illustrates their effect in the frequency domain, in accordance with one or more embodiments of the present invention.
Figure 5A:
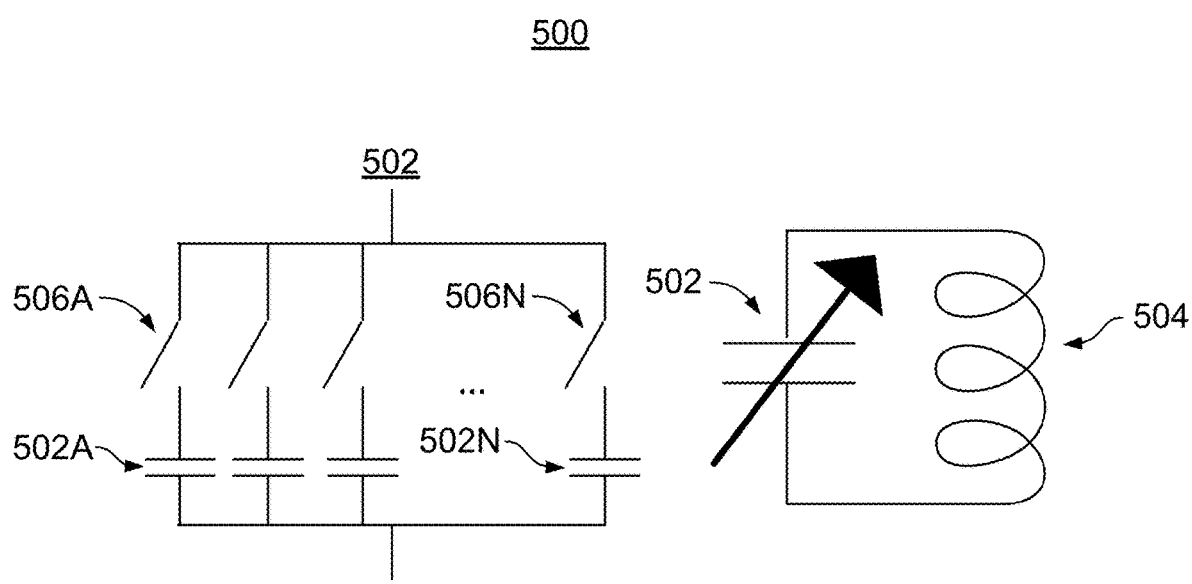
FIGS. 5A-5C illustrate bandpass filters that may be employed by one or more embodiments of the present invention.
Figure 5B:
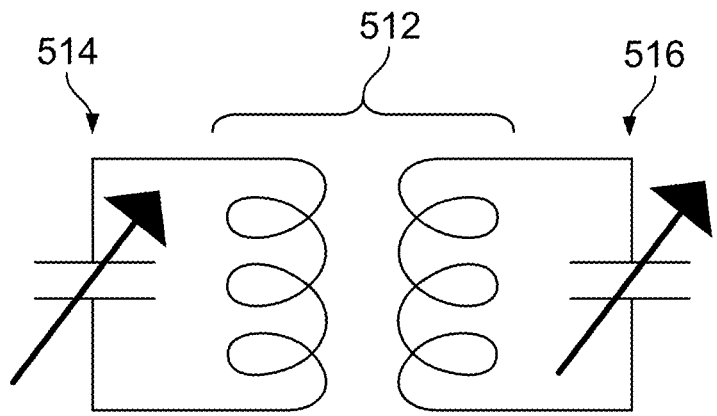
Figure 5C:
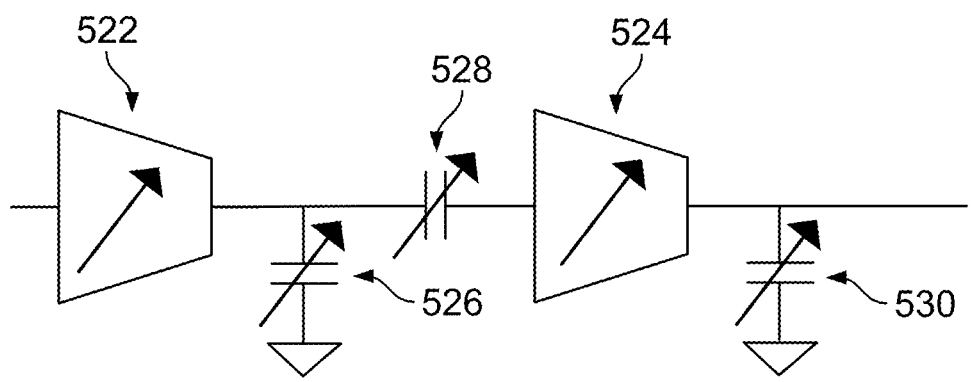

FIGS. 4A and 4B illustrate alternative embodiments of the input bandpass filter 400 (corresponding to input bandpass filter 120) and output alias filter 420 (corresponding to output alias filter 160), respectively. Each of these input bandpass and output alias filters 400, 420 is implemented using a switch 404, 424 to select the input band and alias band having the desired output frequency band. FIG. 4C illustrates the effect of the switchable input bandpass and output alias filters 400, 420 in the frequency domain. The switchable input bandpass (output alias) filter 400 (420) comprises a switch 404 (424), which directs the input RF signal 402 (reconstructed delayed output RF signal 422) to a selected one of a plurality of bandpass filters 406A-406N (426A-426N). Each of the plurality of bandpass filters 406A-406N (426A-426N) passes a corresponding input (alias) band, based upon the known sampling frequency $F_S$. As illustrated in FIG. 4C, bandpass filter 406A (426A) passes the alias band below half the sampling frequency $F_S$ (0.0 $F_S$ to 0.5 $F_S$), while bandpass filter 406B (426B) passes the next alias band above half the sampling frequency $F_S$ (0.5 $F_S$ to 1.0 $F_S$), etc. The permitted alias bands thus correspond to 0-0.5 $F_S$ through $M*F_S/2-(M+1)*F_S/2$. The output 408 (428) of the input bandpass (output alias) filter 400 (420) outputs the input band RF signal 410 to the input sampling switches $132_0$-$132_{15}$ (outputs the alias band output RF signal 430, i.e., alias band output RF signal 324 of FIG. 3A) at the desired output frequency band. The bandpass filters 406A-406N (426A-426N) may be implemented with any suitable circuit configuration including, for example, an LC tank circuit employing a capacitor and an inductor, a tunable transformer that includes tuning capacitors across the input and output, or a $G_m$-C filter. Tunable (or switchable) circuits for these configurations are illustrated in FIGS. 5A-5C. In certain embodiments, the switchable input bandpass and/or output alias filter 400, 420 may, for example, include an amplifier 412, 432 to amplify the input band and/or alias band output RF signal 410, 430. In yet other embodiments, the switchable input bandpass and/or output alias filter 400, 420 may, for example, include a plurality of amplifiers (not illustrated) with each individual bandpass filter 406A-406N (426A-426N) followed (or preceded) by a corresponding one of the plurality of amplifiers. In some of these embodiments, the individual bandpass filter 406A-406N (426A-426N) and the corresponding one of the plurality of amplifiers may be combined into a single bandpass tuned amplifier with, for example, a tuned LC filter load as the amplifier input.

FIG. 4C illustrates a sinusoid at 0.6 $F_S$ as the original signal. Due to aliasing, this original signal is aliased to additional frequencies, including 0.4 $F_S$, 1.4 $F_S$, 1.6 $F_S$, 2.4 $F_S$, 2.6 $F_S$, etc. Assuming that the desired output frequency band is less than the original signal band, bandpass filters 406B, 426A could, for example, pass the frequency band from 0.5 $F_S$ to 1.0 $F_S$ and 0.0 $F_S$ to 0.5 $F_S$, respectively, which would output the alias signal at 0.4 $F_S$. In this instance, the input bandpass and output alias filters 400, 420 support implementation of an overall frequency downconversion function, as the alias band output RF signal 430 has a frequency (0.4 $F_S$) that is less than the frequency of the input RF signal 402 (0.6 $F_S$). Similarly, bandpass filters 406B and 426D could, for example, pass the frequency band from 0.5 $F_S$ to 1.0 $F_S$ and 1.5 $F_S$ to 2.0 $F_S$, respectively, which would output the alias signal at 1.6 $F_S$. In this instance, the input bandpass and output alias filters 400, 420 support implementation of an overall frequency upconversion function, as the alias band output RF signal 430 has a frequency (1.6 $F_S$) that is greater than the input band RF signal 402 (0.6 $F_S$). In a third configuration, bandpass filters 406B and 426B could, for example, both pass the frequency band from 0.5 $F_S$ to 1.0 $F_S$, respectively, which would output the signal at 0.6 $F_S$. In this instance, the input bandpass and output alias filters 400, 420 would not support implementation of either a frequency down or upconversion function, as the alias band output RF signal 430 has a frequency (0.6 $F_S$) that is the same as the input RF signal 402 (0.6 $F_S$). Additional passband filters would pass corresponding frequency bands immediately below and above higher harmonic overtones of the sampling frequency $F_S$. In this manner, by selecting the desired input (output) frequency band, one is implicitly selecting the one of the bandpass filters 406A-406N (426A-426N) that will pass the desired input (output) frequency band, resulting in the desired input band (alias band output) RF signal 410 (430).

FIG. 5A illustrates a bandpass filter 500 implemented using a tunable LC tank circuit with a variable capacitor 502 and an inductor 504, with the variable capacitor 502 used to select the desired output frequency band. The passband of the bandpass filter 500 is altered by the variable capacitor 502, which preferably corresponds to a plurality of individual capacitors 502A-502N. The overall capacitance of variable capacitor 502 in this case is determined by switching in one or more of the individual capacitors 502A-502N via corresponding switches 506A-506N. Other embodiments may use a varactor as an alternative to the variable capacitor 502.

FIG. 5B illustrates a bandpass filter 510 implemented using a tunable transformer with a fixed turn transformer 512 having variable capacitors 514 and 516 across the input and output of the fixed turn transformer 512, respectively, thereby forming the tunable transformer. The variable capacitors 514, 516 are used to select the desired output frequency band. The passband of the bandpass filter 510 is altered by the variable capacitors 514, 516, which may, for example, be implemented like variable capacitor 502, illustrated in FIG. 5A. Other embodiments may use varactors as alternatives to the variable capacitors 514, 516.

FIG. 5C illustrates a bandpass filter 520 implemented using a $G_m$-C filter with one or more transconductors 522, 524 with corresponding variable capacitors 526, 528, 530 at their respective outputs. The variable capacitors 526, 528, 530 are used to select the desired output frequency band. The passband of the bandpass filter 520 is altered by the variable capacitors 526, 528, 530 which may, for example, be implemented like variable capacitor 502, illustrated in FIG. 5A. Other embodiments may use varactors as alternatives to the variable capacitors 526, 528, 530. In yet other embodiments employing a $G_m$-C filter, the transconductance of the one or more transconductors 522, 524 may be varied to select the desired alias band. See B. Nauta, "A CMOS Transconductance-C Filter Technique for Very High Frequencies," IEEE Journal of Solid-State Circuits, vol. 27, no. 2, pp. 142-153 (1992).

Figure 6A:
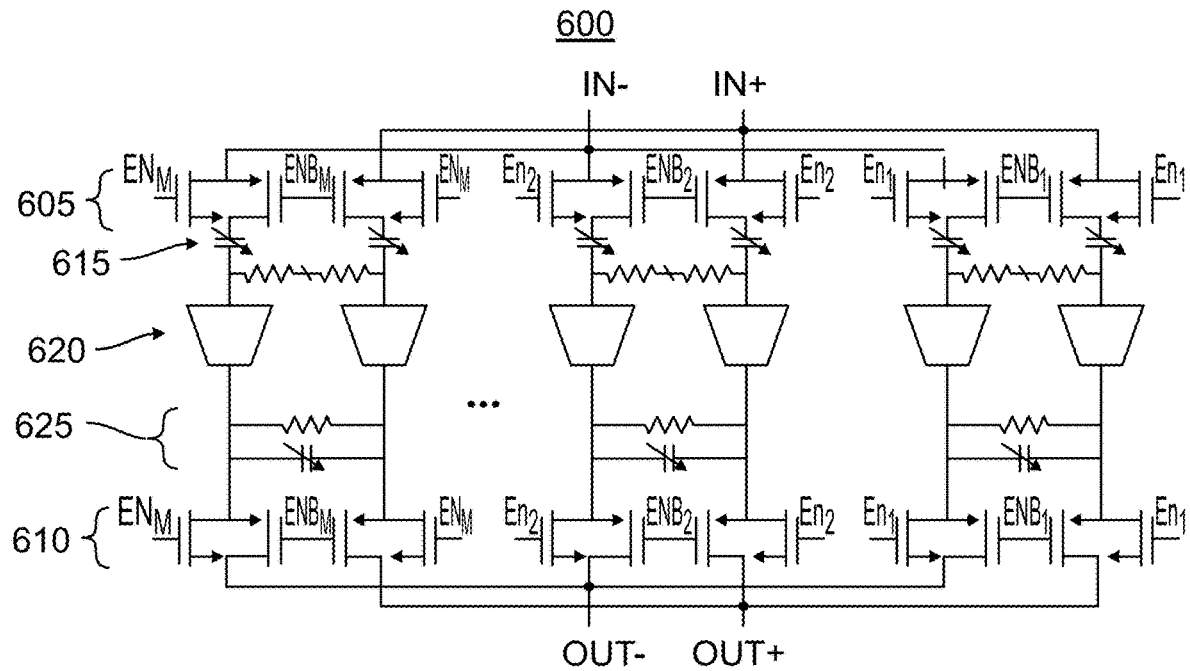
FIGS. 6A-6C illustrate input bandpass and output alias filters employing various switched amplifier chains in accordance with one or more embodiments of the present invention.

FIG. 6A illustrates an output alias filter 160 implemented using a switchable amplifier chain circuit 600 to select the alias band having the desired output frequency band. Note that while the following describes the illustrated circuit as the output alias filter 160, it may also be employed as the input bandpass filter 120. The switchable amplifier chain circuit 600 comprises input switches 605, which direct the reconstructed delayed output RF signal to the desired pair of a plurality of amplifiers 620 based upon the various enable signals EN. Each pair of the plurality of amplifiers 620 provides amplification over a corresponding alias band, based upon the known sampling frequency $F_S$. The corresponding alias band is determined by AC input coupling capacitors 615 and an RC output circuit 625. The output of the switchable amplifier chain circuit 600 outputs the alias band output RF signal at the desired output frequency band. To minimize power, the amplifiers 620 not being used to amplify the desired output frequency band may be turned off. The amplifiers 620 may be implemented with any suitable circuit configuration including, for example, a common source amplifier, an inductively degenerated common source amplifier, or an inverter-based amplifier. See T. Chi et al., "A Millimeter-Wave Polarization-Division-Duplex Transceiver Front-End With an On-Chip Multifeed Self-Interference-Canceling Antenna and an All-Passive Reconfigurable Canceller," IEEE Journal of Solid-State Circuits, vol. 53, no. 12, pp. 3628-3639 (2018), C. Chang and M. Onabajo, "Analysis and Demonstration of an IIP3 Improvement Technique for Low-Power RF Low-Noise Amplifiers," IEEE Transactions on Circuits and Systems I, vol. 65, no. 3, pp. 859-869 (2018), and J. Moody et al., "A mmW Receiver Exploiting Complementary Current Reuse and Power Efficient Bias Point," IEEE Transactions on Microwave Theory and Techniques, vol. 72, no. 3, pp. 1706-1718 (2024), for descriptions of common source, inductively degenerated common source, and inverter-based amplifiers, respectively.

Figure 6B:
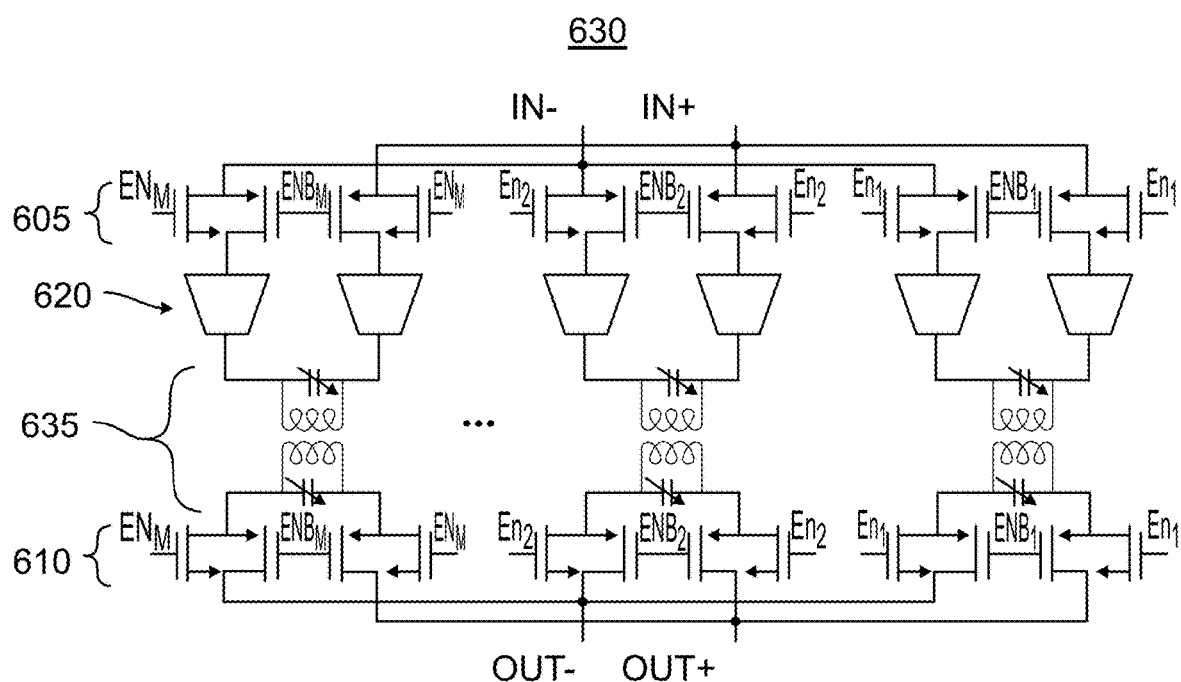
Figure 6C:
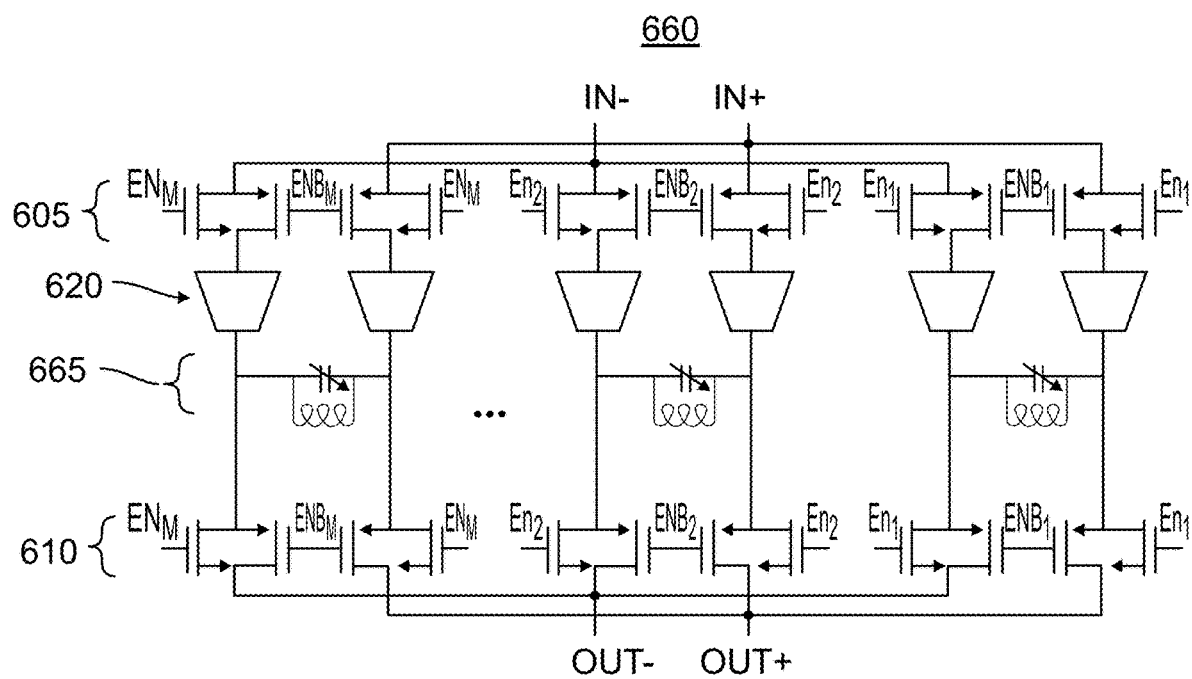

FIG. 6B illustrates an output alias filter 160 implemented using a switchable amplifier chain circuit 630 employing a tunable transformer 635 to select the alias band having the desired output frequency band. FIG. 6C illustrates an output alias filter 160 implemented using a switchable amplifier chain circuit 660 employing a tunable LC tank circuit 665 to select the alias band having the desired output frequency band. The remainder of the switchable amplifier chain circuits 630, 660 operate like the switchable amplifier chain circuit 600. As with the switchable amplifier chain circuit 600, the switchable amplifier chain circuits 630, 660 may likewise be employed as the input bandpass filter 120. Note that in each of the switchable amplifier chain circuits 600, 630, 660, the capacitors and/or resistors may be variable elements to achieve the desired output frequency band.

Figure 7:
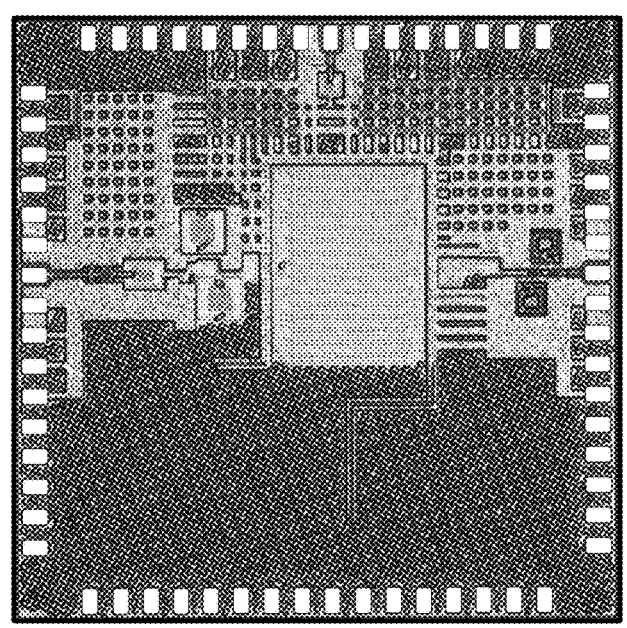
FIG. 7 illustrates a fabricated programmable alias delay device in accordance with one or more embodiments of the present invention.
Figure 8A:
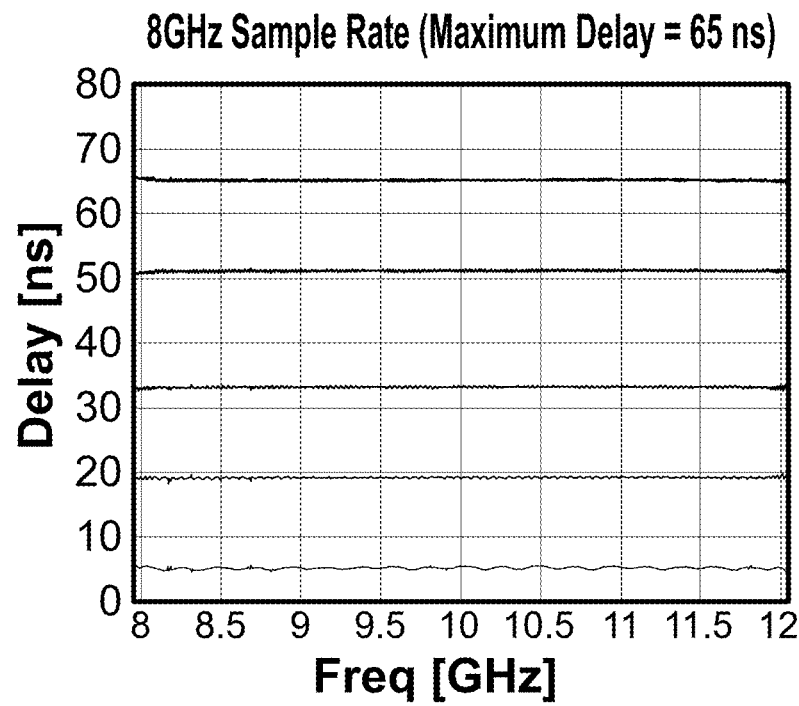
FIGS. 8A and 8B illustrate measured delay times as a function of sampling frequency and input frequency for the fabricated programmable alias delay device illustrated in FIG. 7.
Figure 8B:
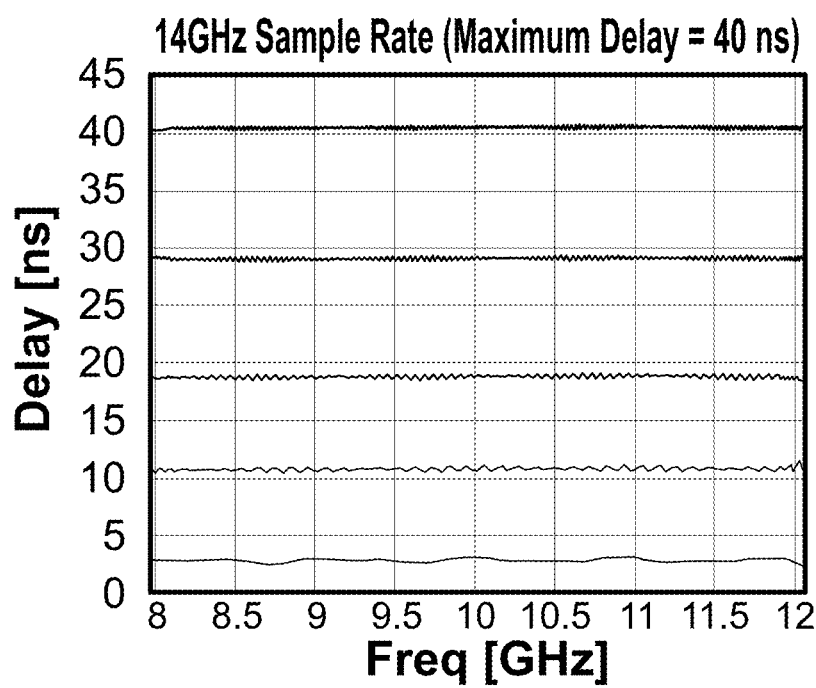

FIG. 7 is a micrograph of a fabricated programmable alias delay device 700 in accordance with one or more embodiments. As illustrated in FIG. 8A, when operated at a sampling rate of 8 GHz, the programmable alias delay device 700 produced uniform time delays of up to 65 ns over an input frequency range of 8 to 12 GHz. Similarly, as illustrated in FIG. 8B, when operated at a sampling rate of 14 GHz, the programmable alias delay device 700 produced uniform time delays of up to 40 ns over an input frequency range of 8 to 12 GHz. Note that in both FIGS. 8A and 8B, only five of the possible 534 delay states are illustrated.

All publications, including but not limited to patents and patent applications, cited in this specification are herein incorporated by reference as though set forth in their entirety in the present application.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A programmable alias delay device comprising:
an input bandpass filter adapted to receive an input RF signal, the input bandpass filter adapted to filter the input RF signal, thereby generating an input band RF signal in a desired input frequency band;
an input sampling stage adapted to receive an input sampling clock at a frequency $F_S$ and the input band RF signal, the input sampling stage including M sampling switched capacitor storage elements, the M sampling switched capacitor storage elements adapted to sequentially sample and hold a corresponding portion of the input band RF signal, the thus sampled and held portions of the input band RF signal being input sampled signals;
a programmable delay stage including M programmable switched capacitor banks, each programmable switched capacitor bank including N delay switched capacitor storage elements, each delay switched capacitor storage element adapted to sample and hold a corresponding time interleaved portion of a corresponding input sampled signal, the thus sampled and held signals being delay sampled switched signals;
an enable timing circuit adapted to receive a desired delay value, the enable timing circuit including a digital counter, the digital counter adapted to count to the desired delay value, upon reaching the desired delay value the enable timing circuit is adapted to output a corresponding output reconstruction clock, an incremental delay value corresponding to $M/F_S$;

an output reconstruction stage including M output reconstruction switches, each output reconstruction switch coupled to a corresponding delay output switch, each output reconstruction switch adapted to output a corresponding time interleaved delay sampled switched signal based upon the output reconstruction clock, the thus output time interleaved delay sampled switched signals being output reconstruction signals, the output reconstruction stage adapted to output the output reconstruction signals in a sequential manner thereby generating a reconstructed delayed output RF signal; and an output alias filter adapted to receive the reconstructed delayed output RF signal and to filter the reconstructed delayed output RF signal, thereby generating an alias band output RF signal in a desired output frequency band.

2. The programmable alias delay device of claim 1, wherein at least one of the input bandpass filter or the output alias filter includes:

a switch having a switch input and a plurality of switch outputs, the switch input adapted to receive an RF signal, the switch adapted to output the received RF signal to a selected one of the plurality of switch outputs;

a plurality of bandpass filters, each of the plurality of bandpass filters coupled to a corresponding one of the plurality of switch outputs, each of the plurality of bandpass filters adapted to pass a corresponding frequency band of the received RF signal; and an output coupled to each of the plurality of bandpass filters, the output adapted to output the corresponding frequency band of the received RF signal from a one of the plurality of bandpass filters coupled to the selected one of the plurality of switch outputs.

3. The programmable alias delay device of claim 2, wherein the at least one of the input bandpass filter or the output alias filter further includes an amplifier coupled to the output, the amplifier adapted to amplify the corresponding frequency band of the received RF signal.

4. The programmable alias delay device of claim 2, wherein each of the plurality of bandpass filters includes:
at least one variable capacitor; and
one of an inductor, a transformer, or a transconductor.

5. The programmable alias delay device of claim 4, wherein the variable capacitor includes:
a plurality of individual capacitors; and
a plurality of switches, each of the plurality of switches being in series with a corresponding one of the plurality of individual capacitors;
wherein an overall capacitance of the variable capacitor is set by switching in one or more of the plurality of individual capacitors.

6. The programmable alias delay device of claim 4, wherein the variable capacitor includes a varactor.

7. The programmable alias delay device of claim 1, wherein the output alias filter includes a switchable amplifier chain circuit, the switchable amplifier chain circuit including:

a switch having a switch input and a plurality of switch outputs, the switch input adapted to receive the reconstructed delayed output RF signal, the switch adapted to output the reconstructed delayed output RF signal to a selected one of the plurality of switch outputs;

a plurality of amplifiers, each of the plurality of amplifier coupled to a corresponding one of the plurality of switch outputs, each of the plurality of amplifiers adapted to amplify and pass a corresponding frequency band including a corresponding alias of the reconstructed delayed output RF signal; and an output coupled to each of the plurality of amplifiers, the output adapted to output the alias band output RF signal from a one of the plurality of amplifier coupled to the selected one of the plurality of switch outputs.

8. The programmable alias delay device of claim 1, further comprising an input buffer, the input buffer adapted to receive the input band RF signal from the input bandpass filter, to buffer the received input band RF signal, and to output the amplified input band RF signal to the input sampling stage.

9. The programmable alias delay device of claim 1, wherein M is equal to or greater than 4.

10. The programmable alias delay device of claim 1, wherein each sampling switched capacitor storage element includes:
an input sampling capacitor adapted to hold a corresponding input sampled signal; and
an input sampling switch adapted to sequentially couple the input band RF signal to the input sampling capacitor.

11. The programmable alias delay device of claim 1, wherein N is equal to or greater than 2.

12. The programmable alias delay device of claim 1, wherein each delay switched capacitor storage element includes:
a switched bank sampling capacitor adapted to hold a corresponding delay sampled switched signal;
an input reset switch adapted to reset the delay switched capacitor storage element; and
an input switched bank switch adapted to couple a corresponding input sampled signal to the switched bank sampling capacitor in a time interleaved manner.

13. The programmable alias delay device of claim 12, wherein each delay switched capacitor storage element further includes a buffer adapted to buffer a corresponding delay sampled switched signal.

14. The programmable alias delay device of claim 1, wherein each output reconstruction switch is coupled to:
a corresponding output capacitor adapted to hold a corresponding output reconstruction signal; and
a corresponding output reset switch adapted to reset a corresponding output capacitor.

15. The programmable alias delay device of claim 1 further comprising:
an input divide-by-M clock adapted to receive a sampling clock signal, to divide the sampling clock signal by M, and to output M thus generated input divide-by-M clock signals; and
M input divide-by-N clocks, each input divide-by-N clock adapted to receive a corresponding input divide-by-M clock signal, to divide the corresponding input divide-by-M clock signal by N, and to output N thus generated input divide-by-N clock signals;
wherein each sampling switched capacitor storage element is adapted to be operated by a corresponding input divide-by-M clock signal; and
wherein each delay switched capacitor storage element is adapted to be operated by a corresponding input divide-by-N clock signal.

16. The programmable alias delay device of claim 15 further comprising a divide-by-P clock adapted to receive the sampling clock signal, to divide the sampling clock signal by P, and to output a thus generated divide-by-P clock signal to the input divide-by-M clock as the sampling clock signal.

17. The programmable alias delay device of claim 15 further comprising an input pulse extend clock adapted to receive the M input divide-by-M clock signals, to lengthen a pulse length of each input divide-by-M clock signal, and to output M thus generated input pulse extended clock signals to the M input divide-by-N clocks as corresponding input divide-by-M clock signals.

18. The programmable alias delay device of claim 15 further comprising:
   M output divide-by-N clocks, each output divide-by-N clock adapted to receive a corresponding input divide-by-M clock signal, to divide the corresponding input divide-by-M clock signal by N, and to output N thus generated output divide-by-N clock signals;
   wherein each output reconstruction switch is adapted to be operated by a corresponding input divide-by-M clock signal; and
   wherein each delay output switch is adapted to be operated by a corresponding output divide-by-N clock signal.

19. The programmable alias delay device of claim 15 further comprising:
   an output divide-by-M clock adapted to receive the sampling clock signal, to divide the sampling clock signal by M, and to output M thus generated output divide-by-M clock signals;
   M output divide-by-N clocks, each output divide-by-N clock adapted to receive a corresponding output pulse extended clock signal, to divide the corresponding output pulse extended clock signal by N, and to output N thus generated output divide-by-N clock signals;
   wherein each output reconstruction switch is adapted to be operated by a corresponding output divide-by-M clock signal; and
   wherein each delay output switch is adapted to be operated by a corresponding output divide-by-N clock signal.

20. The programmable alias delay device of claim 19 further comprising an output pulse extend clock adapted to receive the M output divide-by-M clock signals, to lengthen a pulse length of each output divide-by-M clock signal, and to output M thus generated output pulse extended clock signals to the M output divide-by-N clocks as corresponding output divide-by-M clock signals.

21. The programmable alias delay device of claim 1, wherein the desired input frequency band is one of less than, the same as, or greater than the desired output frequency band.

* * * * *